United States Patent
Ooi et al.

(10) Patent No.: US 8,120,407 B1
(45) Date of Patent: Feb. 21, 2012

(54) TECHNIQUES FOR VARYING PHASE SHIFTS IN PERIODIC SIGNALS

(75) Inventors: Teng Chow Ooi, Penang (MY); Eng Huat Lee, Penang (MY); Chuan Khye Chai, Penang (MY); Yew Fatt (Edwin) Kok, Penang (MY); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 70 days.

(21) Appl. No.: 12/642,738

(22) Filed: Dec. 18, 2009

(51) Int. Cl.
 *H03K 23/00* (2006.01)
(52) U.S. Cl. ........................................ 327/241; 327/147
(58) Field of Classification Search .................. None
See application file for complete search history.

(56) References Cited

U.S. PATENT DOCUMENTS

| | | | |
|---|---|---|---|
| 6,031,428 A * | 2/2000 | Hill | 331/11 |
| 6,211,741 B1 * | 4/2001 | Dalmia | 331/11 |
| 7,227,918 B2 | 6/2007 | Aung et al. | |
| 7,482,841 B1 | 1/2009 | Nguyen et al. | |
| 2006/0056564 A1 | 3/2006 | Takeuchi | |
| 2006/0140321 A1 | 6/2006 | Tell et al. | |
| 2007/0153837 A1 | 7/2007 | Meir et al. | |
| 2008/0084955 A1 | 4/2008 | Chen et al. | |
| 2008/0136485 A1 * | 6/2008 | Takai et al. | 327/263 |

OTHER PUBLICATIONS

Merrick Brownlee et al., "A 3.2Gb/s Oversamling CDR with Improved Jitter Tolerance," IEEE 2007 Custom Integrated Circuits Conference (CICC), pp. 353-356.

* cited by examiner

*Primary Examiner* — Cassandra Cox
(74) *Attorney, Agent, or Firm* — Steven J. Cahill

(57) ABSTRACT

A circuit includes a phase detection circuit and a phase change circuit. The phase detection circuit compares a phase of a first periodic signal to an input signal to generate a gain signal. The phase change circuit provides phase shifts to the first periodic signal in first and second directions when the gain signal has a first value. The phase change circuit increases phase shifts provided to the first periodic signal in the first direction in response to the gain signal changing from the first value to a second value. The phase change circuit provides phase shifts to the first periodic signal in the second direction when the gain signal has the second value that are smaller than the phase shifts provided to the first periodic signal in the first direction when the gain signal has the second value.

25 Claims, 6 Drawing Sheets

TECHNIQUES FOR VARYING PHASE SHIFTS IN PERIODIC SIGNALS

BACKGROUND OF THE INVENTION

The present invention relates to electronic circuits, and more particularly, to techniques for varying phase shifts in periodic signals.

Many modern digital data systems transmit high-speed data without a clock signal. A receiver that receives the transmitted data generates a clock signal from a reference frequency signal using a phase-locked loop. The receiver then phase-aligns the clock signal to the transitions in the data using a clock and data recovery (CDR) circuit.

Periodic jitter in the data or in the reference frequency signal may cause the CDR circuit to get caught in a dead-zone. When the CDR circuit is caught in a dead-zone, the CDR circuit fails to adjust the phase of the recovered clock signal to the appropriate phase in response to the transitions of the input data signal. The CDR circuit may sample incorrect data when the CDR circuit is caught in a dead-zone. Therefore, it would be desirable to provide a CDR circuit that does not get caught in a dead-zone.

BRIEF SUMMARY OF THE INVENTION

According to some embodiments, a circuit includes a phase detection circuit and a phase change circuit. The phase detection circuit compares a phase of a first periodic signal to an input signal to generate a gain signal. The phase change circuit provides phase shifts to the first periodic signal in first and second directions when the gain signal has a first value. The phase change circuit increases phase shifts provided to the first periodic signal in the first direction in response to the gain signal changing from the first value to a second value. The phase change circuit provides phase shifts to the first periodic signal in the second direction when the gain signal has the second value that are smaller than the phase shifts provided to the first periodic signal in the first direction when the gain signal has the second value.

Various objects, features, and advantages of the present invention will become apparent upon consideration of the following detailed description and the accompanying drawings.

DETAILED DESCRIPTION OF THE INVENTION

Figure 1:
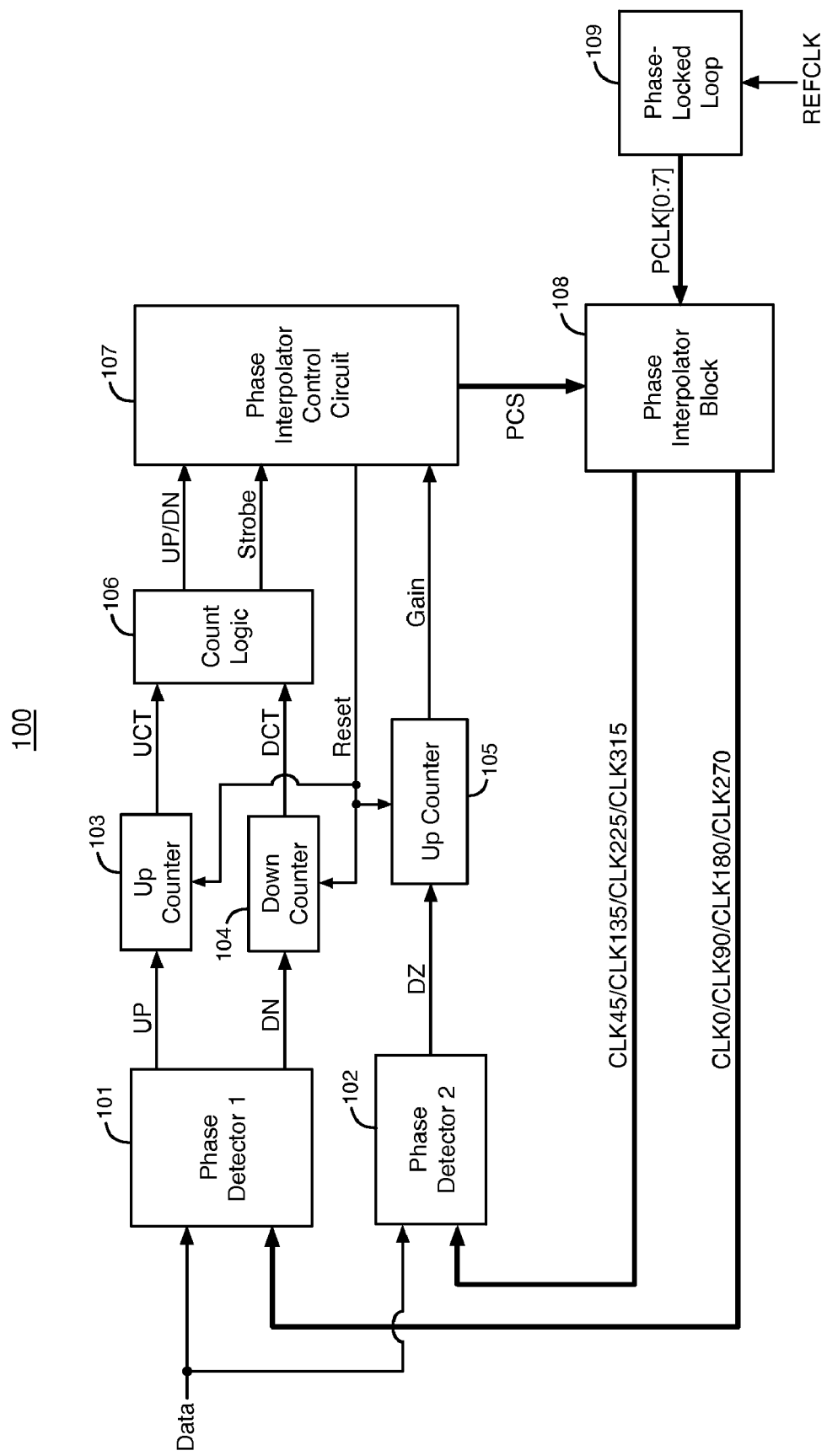
FIG. 1 illustrates an example of a clock and data recovery (CDR) circuit, according to an embodiment of the present invention.

FIG. 1 illustrates an example of a clock and data recovery (CDR) circuit 100, according to an embodiment of the present invention. CDR circuit 100 includes phase detector circuit 101, phase detector circuit 102, up counter circuit 103, down counter circuit 104, up counter circuit 105, count logic circuitry 106, phase interpolator control circuit 107, phase interpolator circuit block 108, and phase-locked loop circuit 109.

CDR circuit 100 is typically fabricated in an integrated circuit such as, for example, an application specific integrated circuit (ASIC), a field programmable gate array (FPGA), a programmable logic device (PLD), a memory integrated circuit, a processor or controller integrated circuit, an analog integrated circuit, etc.

Phase-locked loop (PLL) circuit 109 generates a set of 8 periodic digital clock signals PCLK[0:7] that have the same frequency in response to a reference clock signal REFCLK. PLL 109 can be a digital or an analog PLL. PLL 109 can generate the 8 clock signals PCLK[0:7] using, for example, an oscillator circuit. The 8 clock signals PCLK[0:7] are transmitted from PLL 109 to inputs of phase interpolator circuit block 108.

Phase interpolator circuit block 108 generates 8 recovered periodic digital clock signals CLK0, CLK45, CLK90, CLK135, CLK180, CLK225, CLK270, and CLK315 in response to the 8 clock signals PCLK[0:7] generated by PLL 109. Clock signals CLK0, CLK45, CLK90, CLK135, CLK180, CLK225, CLK270, and CLK315 have relative phases of 0°, 45°, 90°, 135°, 180°, 225°, 270°, and 315°, respectively. Clock signals CLK0, CLK45, CLK90, CLK135, CLK180, CLK225, CLK270, and CLK315 are referred to herein as the recovered clock signals. Each of the 8 recovered clock signals CLK0, CLK45, CLK90, CLK135, CLK180, CLK225, CLK270, and CLK315 has the same frequency as each of the other recovered clock signals.

Phase interpolator circuit block 108 shifts the phases of clock signals CLK0, CLK45, CLK90, CLK135, CLK180, CLK225, CLK270, and CLK315 in response to changes in the logic states of a set of phase control signals PCS generated by phase interpolator control circuit 107. The PCS signals are a set of digital signals that encode the phase setting for phase interpolator circuit block 108.

Phase interpolator circuit block 108 may include one or multiple component phase interpolator circuits. For example, phase interpolator circuit block 108 can include 1, 2, 4, or 8 component phase interpolator circuits. In an embodiment in which phase interpolator circuit block 108 includes 8 component phase interpolator circuits, each of the 8 component phase interpolator circuits can, for example, have the circuit design disclosed in commonly-assigned U.S. patent application Ser. No. 12/496,387, filed Jul. 1, 2009 by Pan et al., which is incorporated by reference herein in its entirety.

According to another embodiment in which phase interpolator circuit block 108 includes 8 component phase interpolator circuits, each of the 8 component phase interpolator circuits can have one of the circuit designs disclosed in commonly-assigned U.S. patent application Ser. No. 12/537,634, filed Aug. 7, 2009 by Ho et al., which is incorporated by reference herein in its entirety. Phase interpolator circuit block 108 converts the sinusoidal output signals of the component phase interpolator circuits into square waveforms that are the 8 recovered clock signals CLK0, CLK45, CLK90, CLK135, CLK180, CLK225, CLK270, and CLK315.

Figure 2:
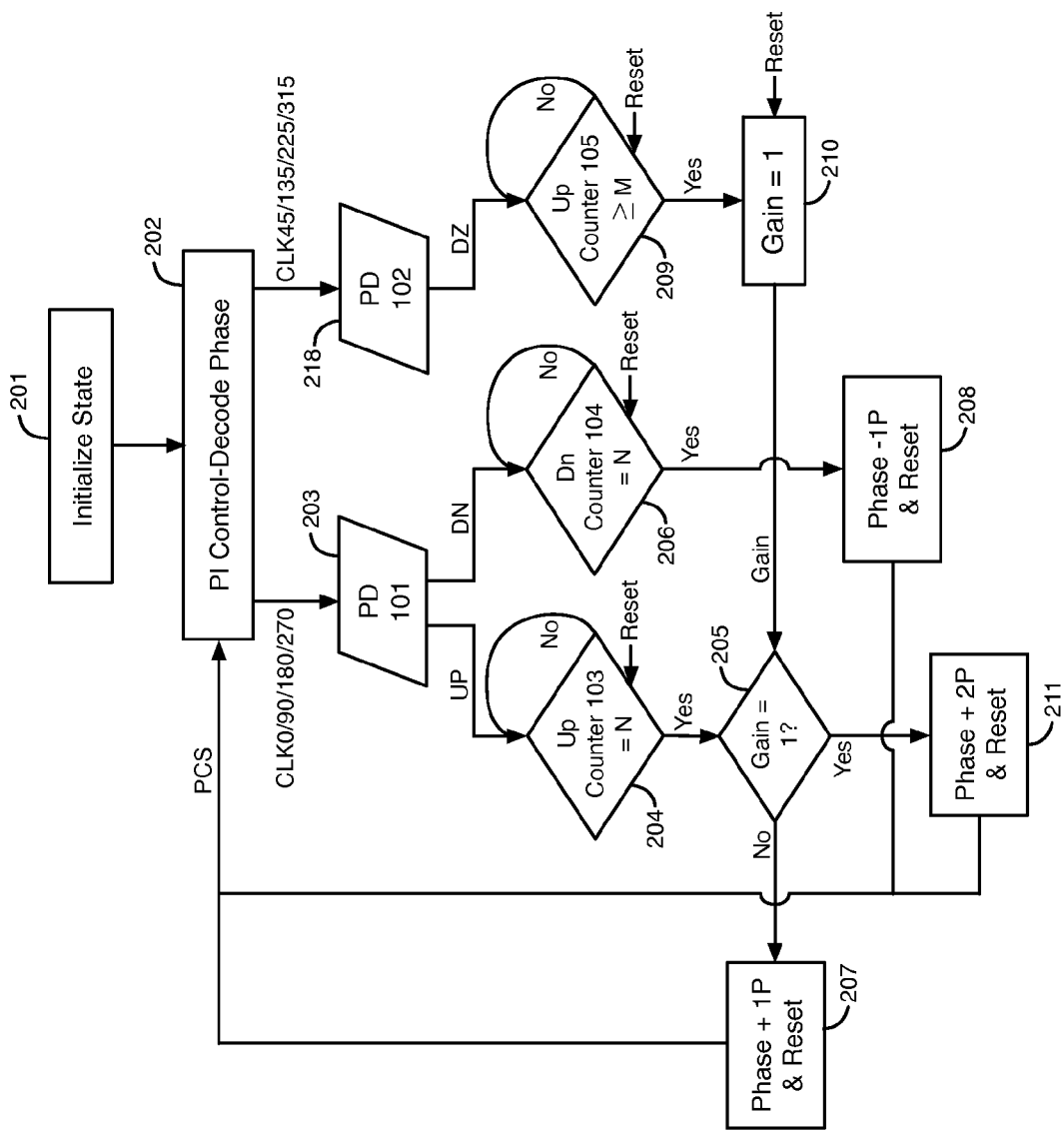
FIG. 2 is a flow chart that illustrates the operation of the CDR circuit of FIG. 1, according to an embodiment of the present invention.

FIG. 2 is a flow chart that illustrates the operation of CDR circuit 100, according to an embodiment of the present invention. The operation of CDR circuit 100 is now described with reference to FIGS. 1 and 2. As shown in FIG. 2, CDR circuit 100 is initialized at step 201. At step 202, phase interpolator (PI) circuit block 108 generates the 8 phase recovered clock signals CLK0, CLK45, CLK90, CLK135, CLK180, CLK225, CLK270, and CLK315 in response to the 8 clock signals PCLK[0:7] generated by PLL 109.

An input Data signal and four of the recovered clock signals CLK0, CLK90, CLK180, and CLK270 are transmitted to inputs of phase detector 101. At step 203, phase detector (PD) circuit 101 compares transitions in the input Data signal to the 4 phases of clock signals CLK0, CLK90, CLK180, and CLK270 to generate two digital phase comparison signals UP and DN. Clock signals CLK0, CLK90, CLK180, and CLK270 are offset in phase at 90° phase intervals. The UP and DN phase comparison signals are indicative of the phase differences between the Data signal and clock signals CLK0, CLK90, CLK180, and CLK270.

In a half-rate embodiment of CDR circuit 100, a unit interval in the input Data signal is one-half the period of the recovered clock signals. One unit interval equals one bit period in the input Data signal. In a half-rate embodiment, phase detector 101 generates a logic high state in the UP signal and a logic low state in the DN signal in response to transitions in the input Data signal occurring less than one-half a unit interval earlier in time than the rising edges in the CLK90 and CLK270 clock signals. Phase detector 101 generates a logic low state in the UP signal and a logic high state in the DN signal in response to transitions in the input Data signal occurring less than one-half a unit interval later in time than the rising edges in the CLK90 and CLK270 clock signals.

According to another embodiment, CDR circuit 100 can be a full-rate CDR circuit, in which the periods of the recovered clock signals and the input Data signal are equal. Alternatively, CDR circuit 100 can be a quad rate CDR circuit, in which the period of the input Data signal equals one-quarter of the periods of the recovered clock signals. CDR 100 can also be used in embodiments having larger or smaller data rates.

The UP phase comparison signal is transmitted from phase detector 101 to an input of up counter circuit 103. Up counter circuit 103 generates an up count value. The clock signal CLK0 is transmitted to inputs of counters 103-105. After each logic low-to-high transition (i.e., rising edge) of CLK0 that occurs while the UP signal is in a logic high state, up counter 103 adds one to the up count value. Counter 103 continues to increment the up count value without resetting the up count value to zero in response to each consecutive or non-consecutive rising edge of CLK0 that occurs while the UP signal is in a logic high state. The up count value of counter 103 only resets to zero in response to the Reset signal described below. For example, if the UP signal is high on a first rising edge of CLK0, low on a second rising edge of CLK0, and high on a third rising edge of CLK0, counter 103 sets the up count value to 2.

At step 204, up counter 103 determines if the up count value equals a maximum count number N (e.g., 32). After the up count value equals the maximum count number N, up counter 103 causes its output signal UCT to transition from a logic low state to a logic high state.

Signal UCT is transmitted to a first input of count logic circuitry 106. Count logic circuitry 106 generates Strobe and UP/DN signals. In response to a logic low-to-high transition in the UCT signal, count logic circuitry 106 drives the Strobe signal from a logic low state to a logic high state, count logic circuitry 106 causes the UP/DN signal to transition to or remain in a logic high state, and CDR circuit 100 proceeds to step 205.

Up counter circuit 105 generates a Gain signal. The UP/DN, Strobe, and Gain signals are transmitted to inputs of phase interpolator control circuit 107. Phase interpolator control circuit 107 generates the phase control signals PCS that are transmitted to inputs of phase interpolator block 108. Phase interpolator control circuit 107 sets the logic states of the phase control signals PCS based on the logic states of the UP/DN, Strobe, and Gain signals. Phase interpolator control circuit 107 can be, for example, a state machine circuit or a controller circuit. Phase interpolator control circuit 107 can, for example, be implemented using programmable logic blocks configured to perform the functions described herein. Phase interpolator block 108 decodes the phase control signals PCS to generate decoded signals that select the phases of the recovered clock signals CLK0, CLK45, CLK90, CLK135, CLK180, CLK225, CLK270, and CLK315.

At step 205, phase interpolator control circuit 107 determines if the Gain signal is in a logic high state. As an example, it is assumed that the Gain signal is in a logic low state during this particular iteration of the flow chart of FIG. 2, and CDR circuit 100 proceeds from step 205 to step 207.

At step 207, phase interpolator control circuit 107 changes the phase control signals PCS to logic states that cause the phases of the recovered clock signals CLK0, CLK45, CLK90, CLK135, CLK180, CLK225, CLK270, and CLK315 to occur earlier in time by 1 phase interval (i.e., +1P). Phase interpolator control circuit 107 and phase interpolator block 108 shift the phases of the recovered clock signals by +1P in response to the Gain signal being in a logic low state, the UP/DN signal being in a logic high state, and a logic low-to-high transition in the Strobe signal. 1 phase interval (1P), for example, refers to the smallest phase change that phase interpolator block 108 can generate in the recovered clock signals CLK0, CLK45, CLK90, CLK135, CLK180, CLK225, CLK270, and CLK315. As a specific example, 1 phase interval (1P) may be 5.625° (i.e., 360°/64 phase steps). The examples provided herein are not intended to be limiting.

Phase interpolator control circuit 107 also generates a Reset signal. The Reset signal is transmitted from phase interpolator control circuit 107 to counters 103-105. Phase interpolator control circuit 107 generates a logic high pulse in the Reset signal after each logic low-to-high transition in the Strobe signal. For example, phase interpolator control circuit 107 generates a logic high pulse in the Reset signal at step 207. After the Reset signal transitions to a logic high state, up counter 103 resets the UCT signal to a logic low state, counter 104 resets the DCT signal to a logic low state, and up counter 105 resets the Gain signal to a logic low state. Count logic circuitry 106 resets the Strobe signal to a logic low state in response to a logic high-to-low transition in the UCT or DCT signals.

At step 202, phase interpolator block 108 shifts the phases of the recovered clock signals CLK0, CLK45, CLK90, CLK135, CLK180, CLK225, CLK270, and CLK315 to occur earlier in time by 1P based on the change in the phase control signals PCS. The phase shifted recovered clock signals are transmitted to phase detectors 101 and 102.

The DN phase comparison signal is transmitted from phase detector 101 to an input of down counter 104. Down counter circuit 104 generates a down count value. After each rising edge of CLK0 that occurs while the DN signal is in a logic high state, down counter 104 adds one to the down count value. Counter 104 continues incrementing the down count value without resetting the down count value to zero in response to each consecutive or non-consecutive rising edge of CLK0 that occurs while DN is in a logic high state. The down count value of counter 104 only resets to zero in response to the Reset signal. For example, if the DN signal is high on a first rising edge of CLK0, low on a second rising edge of CLK0, and high on a third rising edge of CLK0, counter 104 sets the down count value to 2.

At step 206, down counter 104 determines if the down count value equals the maximum count number N (e.g., 32). After the down count value equals the maximum count number N, down counter 104 causes its output signal DCT to transition from a logic low state to a logic high state. Signal DCT is transmitted to a second input of count logic circuitry 106. In response to a logic low-to-high transition in the DCT signal, count logic circuitry 106 causes the Strobe signal to transition from a logic low state to a logic high state, and count logic circuitry 106 causes the UP/DN signal to transition to or remain in a logic low state.

Then at step 208, phase interpolator control circuit 107 changes the phase control signals PCS to logic states that cause the phases of the recovered clock signals CLK0/CLK45/CLK90/CLK135/CLK180/CLK225/CLK270/CLK315 to occur later in time by 1 phase interval (i.e., −1P), in response to the UP/DN signal being in a logic low state and a logic low-to-high transition in the Strobe signal. After the low-to-high transition in the Strobe signal, phase interpolator control circuit 107 generates a logic high pulse in the Reset signal at step 208, which causes the UCT, DCT, Gain, and Strobe signals to reset to logic low states. At step 202, phase interpolator block 108 shifts the phases of the recovered clock signals CLK0, CLK45, CLK90, CLK135, CLK180, CLK225, CLK270, and CLK315 to occur later in time by −1P based on the change in the phase control signals PCS. In this embodiment, +1P equals the absolute value of −1P.

The input Data signal and four of the recovered clock signals CLK45, CLK135, CLK225, and CLK315 are transmitted to inputs of phase detector circuit 102. At step 218, phase detector circuit 102 compares transitions in the input Data signal to the 4 phases of the 4 clock signals CLK45, CLK135, CLK225, and CLK315 to generate digital phase comparison signal DZ. Clock signals CLK45, CLK135, CLK225, and CLK315 are offset in phase at 90° phase intervals. The DZ phase comparison signal is indicative of the phase differences between the Data signal and clock signals CLK45, CLK135, CLK225, and CLK315. Phase detector circuit 102 generates a logic high state in the DZ signal when CDR circuit 100 is in or near a dead-zone. In a half-rate embodiment, CDR circuit 100 is in or near a dead-zone when the rising edges of each of the CLK0 and CLK180 clock signals occur more than one-quarter of a unit interval before or after the center of the sampling window of the input Data signal, e.g., between −0.25 unit interval (UI) and 0.25 UI, between 0.75 UI and 1.25 UI, between 1.75 UI and 2.25 UI, etc.

In a half-rate embodiment, phase detector 102 generates a logic high state in the DZ signal when the mid-points of the transitions in the input Data signal (i.e., at 0 UI, 1.0 UI, 2.0 UI, etc.) do not occur between the rising edges of CLK45 and CLK135 or between the rising edges of CLK225 and CLK315. Phase detector 102 generates a logic low state in the DZ signal in response to the mid-points of transitions in the input Data signal occurring between the rising edges of CLK45 and CLK135 and between the rising edges of CLK225 and CLK315.

One or both of phase detectors 101 and 102 can be, for example, a bang-bang phase detector, such as the differential bang-bang phase detector disclosed in commonly-assigned U.S. Pat. No. 7,482,841 issued Jan. 27, 2009, which is incorporated by reference herein in its entirety. The input Data signal can be a single-ended or differential signal.

The DZ phase comparison signal is transmitted from the output of phase detector 102 to the input of up counter circuit 105. Up counter circuit 105 generates an up count value. After each rising edge of CLK0 that occurs while the DZ signal is in a logic high state, up counter 105 adds one to its up count value. Counter 105 continues incrementing its up count value without resetting its up count value to zero in response to each consecutive and non-consecutive rising edge of CLK0 that occurs while DZ is in a logic high state. The up count value of counter 105 only resets to zero in response to the Reset signal.

At step 209, up counter 105 continues to increase its up count value until its up count value is greater than or equal to a maximum count number M (e.g., 16). In some embodiments, counters 103-105 are programmable counter circuits that have programmable maximum count numbers N and M. In these embodiments, count numbers N and M can be programmed to any desired values. In some embodiments, the maximum count number M is one-half of the maximum count number N of counters 103-104.

After the up count value of counter 105 equals or exceeds the maximum count number M, up counter 105 causes its output signal Gain to transition from a logic low to a logic high state (i.e., Gain=1) at step 210. The Gain signal is transmitted to an input of phase interpolator control circuit 107. At step 205, phase interpolator control circuit 107 determines that the Gain signal is in a logic high state.

As discussed above, a logic low-to-high transition occurs in the Strobe signal and the UP/DN signal is in a logic high state in response to the up count value of counter 103 reaching the maximum count number N. If the Gain, UP/DN, and Strobe signals are in logic high states, CDR circuit 100 proceeds from step 205 to step 211. At step 211, phase interpolator control circuit 107 changes the phase control signals PCS to logic states that cause the phases of the recovered clock signals CLK0, CLK45, CLK90, CLK135, CLK180, CLK225, CLK270, and CLK315 to occur earlier in time by 2 phase intervals (i.e., +2P), in response to the UP/DN, Strobe, and Gain signals being in logic high states. 2 phase intervals (+2P) may, for example, equal two times the smallest phase change that phase interpolator block 108 can generate in the recovered clock signals.

After the logic low-to-high transition in the Strobe signal, phase interpolator control circuit 107 generates a logic high pulse in the Reset signal at step 211, which causes the UCT, DCT, Gain, and Strobe signals to reset to logic low states. At step 202, phase interpolator block 108 shifts the phases of the recovered clock signals CLK0, CLK45, CLK90, CLK135, CLK180, CLK225, CLK270, and CLK315 to occur earlier in time by 2 phase intervals based on the change in the phase control signals PCS.

Up counter 105 asserts the Gain signal after CDR circuit 100 remains in or near a dead-zone for a predefined number M of consecutive or non-consecutive clock cycles. CDR circuit 100 typically generates alternating pulses in the UP and DN signals (e.g., UP, DN, UP, DN, UP, etc.) when CDR circuit 100 is stuck in the dead-zone. In a half-rate embodiment, the dead-zone occurs when the rising edges in the CLK0 and CLK180 signals occur near 0 UI, 1.0 UI, 2.0 UI, etc.

CDR circuit 100 increases the phases of the recovered clock signals by a larger phase shift (e.g., by +2P) in response to logic high pulses in the UCT and Gain signals. CDR circuit 100 decreases the phases of the recovered clock signals by a smaller phase shift (e.g., by −1P) in response to logic high pulses in the DCT and Gain signals. Thus, when CDR circuit 100 is in or near a dead-zone, CDR circuit 100 generates an unbalanced gain in the phases of the recovered clock signals that shifts the rising edges of CLK0 and CLK180 out of the dead-zone and into the sampling window in response to the Gain signal.

For example, if CDR circuit 100 is generating alternating UP and DN pulses as a result of being stuck in a dead-zone, phase interpolator block 108 generates alternating phase shifts of +2P and −1P in the recovered clock signals that cause the phases of the recovered clock signals to shift earlier in time by 1P for every 2 logic high pulses of the Strobe signal. As a result, the CLK0 and CLK180 signals shift out of the dead-zone and into the sampling windows of the Data signal. Subsequently, the Gain signal is de-asserted and phase interpolator block 108 generates equal phase shifts of +1P and −1P in the recovered clock signals, as described above.

In other embodiments, CDR circuit 100 increases the phases of the recovered clock signals by an amount other than +2P in response to logic high pulses in the UCT and Gain signals. For example, CDR circuit 100 can increase the phases of the recovered clock signals by +1.5P, +1.75P, +2.25P, or +2.5P in response to logic high pulses in the UCT and Gain signals.

Figure 3A:
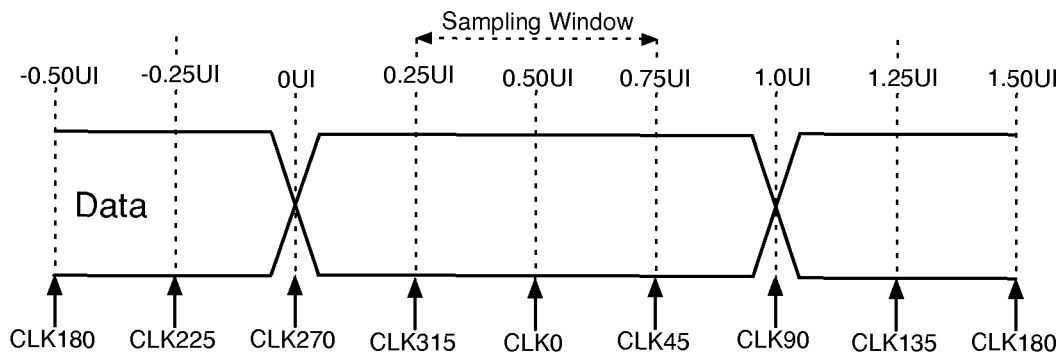
FIG. 3A is a timing diagram that illustrates an example of an ideal timing relationship between the input Data signal and the recovered clock signals, according to an embodiment of the present invention.

FIG. 3A is a timing diagram that illustrates an example of an ideal timing relationship between the input Data signal and the recovered clock signals, according to an embodiment of the present invention. The waveforms shown in FIGS. 3A-3F represent examples of the input Data signal. The upward pointing arrows in FIGS. 3A-3F represent the rising edges of the recovered clock signals generated by phase interpolator block 108. In FIGS. 3A-3F, UI represents a unit interval in the input Data signal.

In an embodiment, clock signals CLK0 and CLK180 are used to sample the input Data signal. In this embodiment, the rising edges of clock signals CLK0 and CLK180 ideally occur at the center of the sampling window in each unit interval (UI) of the input Data signal, as shown, for example, in FIG. 3A. The centers of the sampling windows of the input Data signal occur at −0.50 UI, 0.50 UI, 1.50 UI, 2.50 UI, etc. When the rising edges of clock signals CLK0 and CLK180 occur at the centers of the sampling windows, phase detector 102 generates a logic low state in the DZ signal, and phase detector 101 dithers between generating logic high pulses in the UP and DN signals.

Figure 3B:
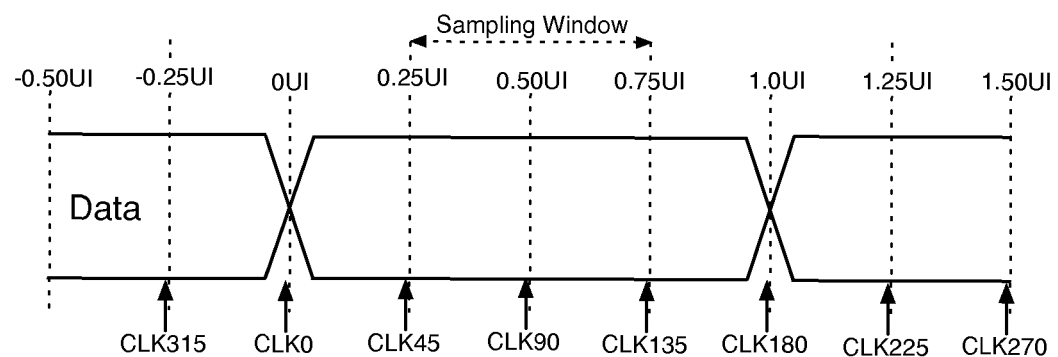
FIGS. 3B, 3C, and 3D are timing diagrams that illustrate examples of timing relationships between the input Data signal and the recovered clock signals that cause the second phase detector in FIG. 1 to generate a logic high state in its output signal, according to embodiments of the present invention.
Figure 3C:
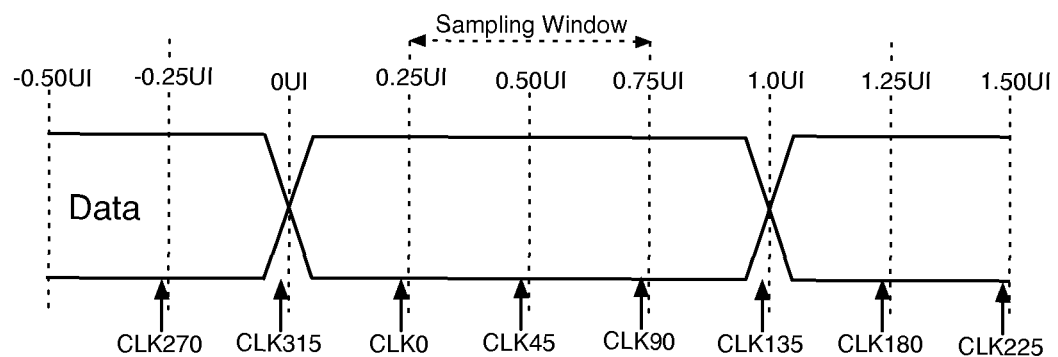
Figure 3D:
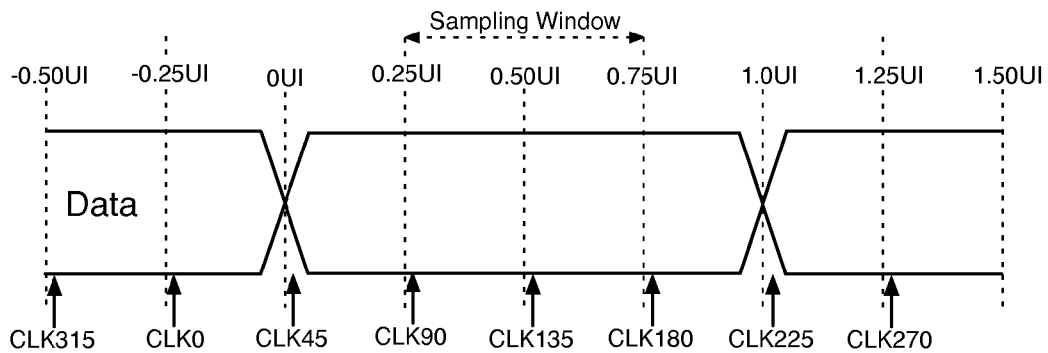

FIGS. 3B-3D are timing diagrams that illustrate examples of timing relationships between the input Data signal and the recovered clock signals that cause phase detector 102 to generate a logic high state in the DZ signal. In each of the examples of FIGS. 3B-3D, the rising edges of clock signal CLK0 occur in or near the dead-zone between −0.25 UI and 0.25 UI, and the rising edges of clock signal CLK180 occur in or near the dead-zone between 0.75 UI and 1.25 UI.

Also, the first state transitions in the input Data signal at 0 UI shown in the examples of FIGS. 3B-3D occur before the rising edges in CLK45, and the second state transitions in the input Data signal at 1.0 UI occur after the rising edges in CLK135. As a result, the phase relationships between the input Data signal and the recovered clock signals shown in FIGS. 3B-3D cause phase detector 102 to generate a logic high state in the DZ signal.

After CDR circuit 100 has been in or near the dead-zone for more than a predefined number of clock cycles as measured by counter 105, the Gain signal is asserted, and CDR circuit 100 shifts the phases of the recovered clock signals to occur earlier in time by 2 phase intervals (i.e., +2P) in response to the UCT signal. Because CDR circuit 100 increases the phases of the recovered clock signals by a larger phase shift (i.e., +2P) in response to the UCT signal than the phase shift (i.e., −1P) that occurs in the recovered clock signals in response to the DCT signal when the Gain signal is asserted, clock signals CLK0 and CLK180 move away from the dead-zone and into the sampling window.

Figure 3E:
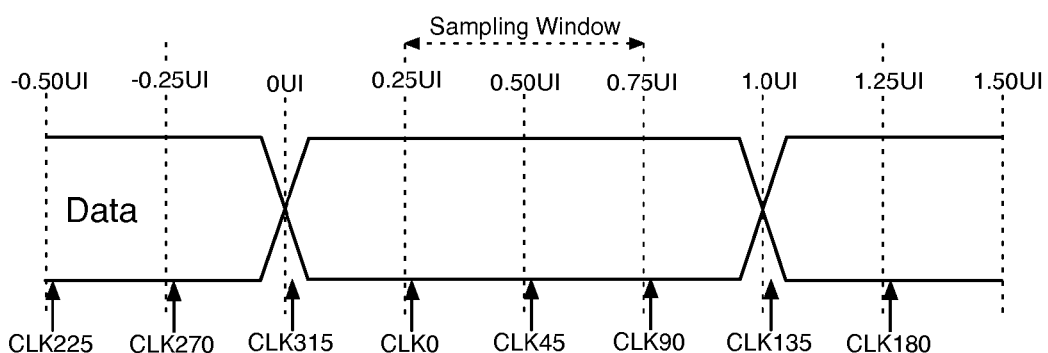
FIGS. 3E-3F are timing diagrams that illustrate examples of timing relationships between the input Data signal and the recovered clock signals that cause the second phase detector in FIG. 1 to generate a logic low state in its output signal, according to embodiments of the present invention.
Figure 3F:
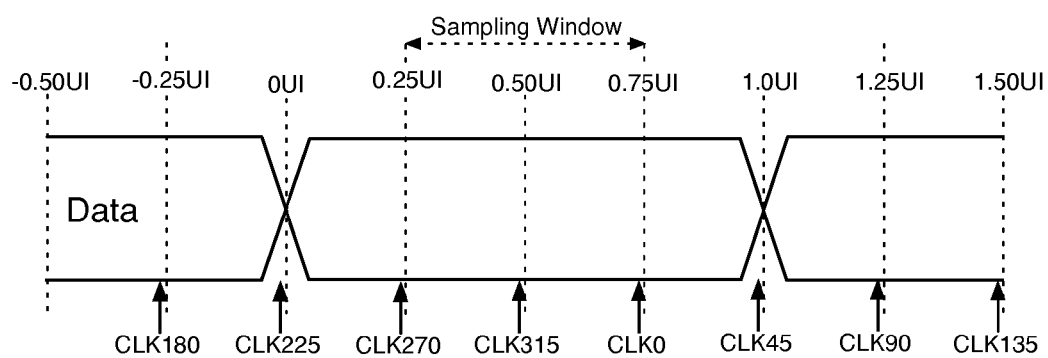

FIGS. 3E-3F are timing diagrams that illustrate examples of timing relationships between the input Data signal and the recovered clock signals that cause phase detector 102 to generate a logic low state in the DZ signal. In each of the examples of FIGS. 3E-3F, the rising edges of clock signal CLK0 occur within the sampling window between 0.25 UI and 0.75 UI. In FIG. 3E, the rising edge of clock signal CLK180 occurs in the sampling window between 1.25 UI and 1.75 UI. In FIG. 3F, the rising edge of clock signal CLK180 occurs in the sampling window between −0.75 UI and −0.25 UI.

Also, the first state transitions in the input Data signal at 0 UI shown in the examples of FIGS. 3E-3F occur before the rising edges in CLK45, and the second state transitions in the input Data signal at 1.0 UI occur before the rising edges in CLK135. As a result, the phase relationships between the input Data signal and the recovered clock signals shown in FIGS. 3E-3F cause phase detector 102 to generate a logic low state in the DZ signal.

According to additional embodiments, the techniques described herein can be applied to delay-locked loop (DLL) circuits and to phase-locked loop (PLL) circuits.

CDR circuit 100 can be used as a delay-locked loop circuit by replacing the input Data signal with a periodic input reference clock signal that is transmitted to the inputs of phase detectors 101 and 102. CDR circuit 100 can be modified to be a phase-locked loop circuit by replacing the input Data signal with a periodic input reference clock signal that is transmitted to the inputs of phase detectors 101 and 102 and by replacing phase interpolator block 108 with an oscillator circuit (e.g., a ring oscillator or an LC tank oscillator).

Figure 4:
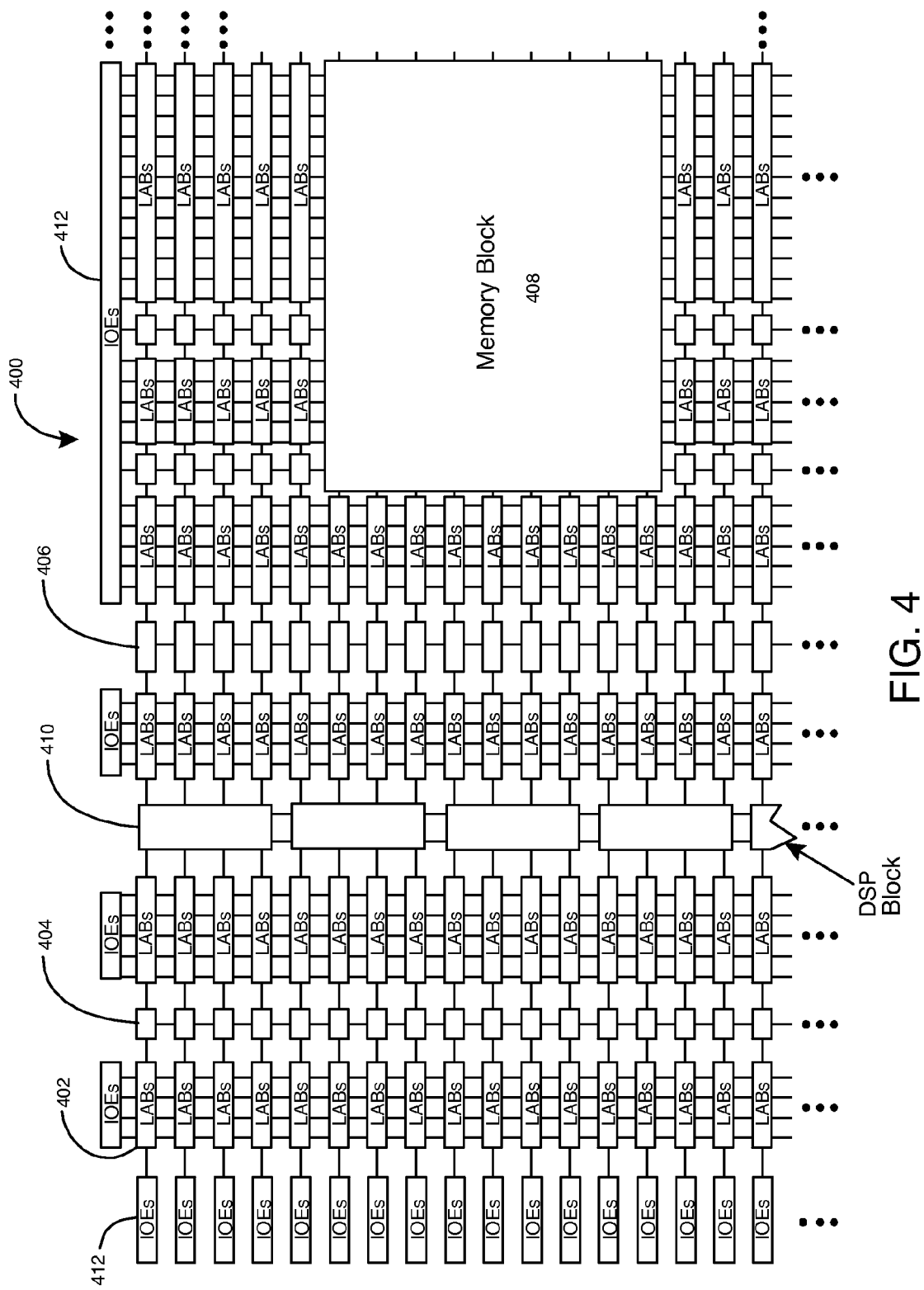
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pads of the integrated circuit. The pads are external terminals of the FPGA die that can be used to route, for example, input signals, output signals, and supply voltages between the FPGA and one or more external devices. IOEs 412 also include clock and data recovery circuits, such as CDR circuit 100, that receive input data signals transmitted through pads of the integrated circuit from an external source. It should be understood that FPGA 400 is described herein for illustrative purposes only and that the present invention can be implemented in many different types of integrated circuits.

Figure 5:
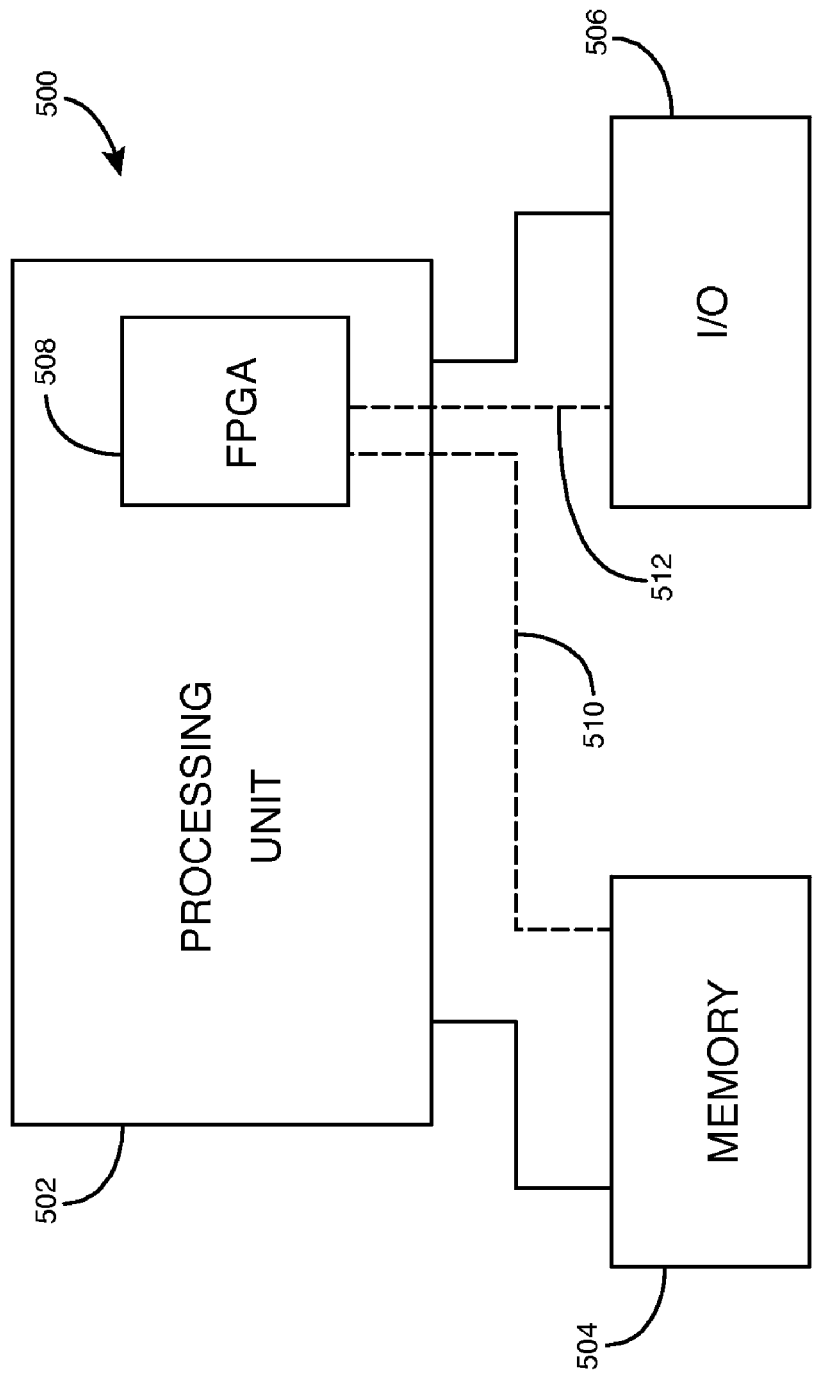
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor that can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a phase detection circuit that compares a phase of a first periodic signal to an input signal to generate a gain signal; and
   a phase change circuit that provides phase shifts to the first periodic signal in first and second directions when the gain signal has a first value, wherein the phase change circuit increases phase shifts provided to the first periodic signal in the first direction when the gain signal has a second value, and wherein the phase change circuit provides phase shifts to the first periodic signal in the second direction when the gain signal has the second value that are smaller than the phase shifts provided to the first periodic signal in the first direction when the gain signal has the second value.

2. The circuit of claim 1 wherein the phase detection circuit comprises:
   a first phase detector that compares the phase of a second periodic signal to the input signal to generate first and second phase comparison signals; and
   a second phase detector that compares a phase of the first periodic signal to the input signal to generate a third phase comparison signal, wherein the phase change circuit provides phase shifts to the second periodic signal in the first and the second directions when the gain signal has the first value, wherein the phase change circuit increases phase shifts provided to the second periodic signal in the first direction when the gain signal has the second value, and wherein the phase change circuit provides phase shifts to the second periodic signal in the second direction when the gain signal has the second value that are smaller than the phase shifts provided to the second periodic signal in the first direction when the gain signal has the second value.

3. The circuit of claim 2 wherein the phase detection circuit further comprises:
   a counter circuit that generates a phase change signal in response to the first and the second phase comparison signals.

4. The circuit of claim 3 wherein the counter circuit generates a direction signal in response to the first and the second phase comparison signals, and wherein the phase change circuit determines whether to adjust the phases of the first and the second periodic signals in the first direction or in the second direction based on the phase change signal and the direction signal.

5. The circuit of claim 4 wherein the counter circuit comprises an up counter that generates an up count signal based on the first phase comparison signal, a down counter that generates a down count signal based on the second phase comparison signal, and control logic that generates the phase change signal and the direction signal based on the up and the down count signals.

6. The circuit of claim 2 wherein the phase detection circuit further comprises:
   a counter circuit that generates the gain signal in response to the third phase comparison signal.

7. The circuit of claim 3 wherein the phase change circuit comprises:
   a control circuit that generates at least one phase control signal in response to the phase change signal and the gain signal; and
   at least one phase interpolator circuit that generates the first and the second periodic signals and that shifts the phases of the first and the second periodic signals based on a change in the phase control signal.

8. The circuit of claim 7 wherein the control circuit resets the phase change signal and the gain signal in response to a variation in the phase change signal.

9. The circuit of claim 1 wherein the circuit is in an integrated circuit, and wherein the circuit is a clock and data recovery circuit.

10. The circuit of claim 2 wherein the first phase detector compares phases of the second, third, fourth, and fifth periodic signals to the input signal to generate the first and the second phase comparison signals, and wherein the second phase detector compares phases of the first, sixth, seventh, and eighth periodic signals to the input signal to generate the third phase comparison signal.

11. A circuit comprising:
   a first phase detection circuit that compares a phase of a first periodic signal to an input signal to generate a phase change signal;
   a second phase detection circuit that compares a phase of a second periodic signal to the input signal to generate a gain signal; and
   a phase interpolation circuit that adjusts the phases of the first and the second periodic signals relative to the input signal in response to the phase change signal, wherein the phase interpolation circuit provides a first phase shift to each of the first and the second periodic signals in a first direction in response to the gain signal having a first value that is smaller than a second phase shift the phase interpolation circuit provides to each of the first and the second periodic signals in the first direction in response to the gain signal having a second value, and wherein the phase interpolation circuit provides a third phase shift to each of the first and the second periodic signals in a second direction in response to the gain signal having the second value that is smaller than the second phase shift the phase interpolation circuit provides to each of the first and the second periodic signals in the first direction in response to the gain signal having gin the second value.

12. The circuit of claim 11 wherein the first phase detection circuit comprises:
   a first phase detector circuit that compares the phase of the first periodic signal to the input signal to generate first and second phase comparison signals;
   a first counter circuit that generates a first count signal based on the first phase comparison signal;
   a second counter circuit that generates a second count signal based on the second phase comparison signal; and
   count logic that generates the phase change signal and a direction signal based on the first and the second count signals.

13. The circuit of claim 12 wherein the second phase detection circuit comprises:
   a second phase detector circuit that compares the phase of the second periodic signal to the input signal to generate a third phase comparison signal; and
   a third counter circuit that generates the gain signal based on the third phase comparison signal.

14. The circuit of claim 11 wherein the phase interpolation circuit comprises:
   a phase interpolator control circuit that generates at least one phase control signal based on the phase change signal and the gain signal; and
   at least one phase interpolator circuit that shifts the phases of the first and the second periodic signals based on a variation in the phase control signal.

15. The circuit of claim 14 wherein the phase interpolator circuit generates the first, the second, third, fourth, fifth, sixth, seventh, and eighth periodic signals, wherein the first phase detection circuit compares phases of the first, the third, the fifth, and the seventh periodic signals to the input signal to generate the phase change signal, and wherein the second phase detection circuit compares phases of the second, the fourth, the sixth, and the eighth periodic signals to the input signal to generate the gain signal.

16. The circuit of claim 11 wherein the phase interpolation circuit adjusts the phases of the first and the second periodic signals by first incremental phase shifts in the first direction when the gain signal has the first value, wherein the phase interpolation circuit adjusts the phases of the first and the second periodic signals by second incremental phase shifts in the second direction when the gain signal has the second value, and wherein each of the first increment phase shifts has a magnitude equal to a magnitude of each of the second incremental phase shifts.

17. A clock and data recovery circuit comprising:
   a first phase detector circuit that compares a phase of a first periodic signal to a data signal to generate first and second phase comparison signals;
   a second phase detector circuit that compares a phase of a second periodic signal to the data signal to generate a third phase comparison signal;
   a first counter circuit that generates a first count signal based on the first phase comparison signal;
   a second counter circuit that generates a second count signal based on the second phase comparison signal;
   a third counter circuit that generates a gain signal based on the third phase comparison signal;
   a control circuit that generates at least one phase control signal based on the first and the second count signals and the gain signal; and
   a phase interpolator circuit block that shifts the phases of the first and the second periodic signals relative to the data signal based on the phase control signal.

18. The clock and data recovery circuit of claim 17 wherein the control circuit comprises:
   count logic that generates a direction signal and a phase change signal based on the first and the second count signals; and
   a phase interpolator control circuit that generates the phase control signal based on the gain signal, the phase change signal, and the direction signal.

19. The clock and data recovery circuit of claim 17 wherein the phase interpolator circuit block generates the first, the second, third, fourth, fifth, sixth, seventh, and eighth periodic signals, wherein the first phase detector circuit compares phases of the first, the third, the fifth, and the seventh periodic signals to the data signal to generate the first and the second phase comparison signals, and wherein the second phase detector circuit compares phases of the second, the fourth, the sixth, and the eighth periodic signals to the data signal to generate the third phase comparison signal.

20. The clock and data recovery circuit of claim 17 wherein the control circuit causes the phase interpolator circuit block to increase phase shifts provided to the first and the second periodic signals in a first direction in response to the gain signal changing from a first value to a second value, and wherein the phase interpolator circuit block keeps phase shifts provided to the first and the second periodic signals constant in a second direction in response to the gain signal changing from the first value to the second value.

21. A method comprising:
   comparing a phase of a first periodic signal to an input signal to generate a phase change signal;
   comparing a phase of a second periodic signal to the input signal to generate a gain signal;
   shifting the phases of the first and the second periodic signals relative to the input signal in response to the phase change signal;
   increasing incremental phase shifts provided to the first and the second periodic signals in a first direction in response to the gain signal changing from a first value to a second value; and
   providing incremental phase shifts to the first and the second periodic signals in a second direction that are smaller than the phase shifts provided to the first and the second periodic signals in the first direction in response to the gain signal changing from the first value to the second value.

22. The method of claim 21 wherein providing incremental phase shifts to the first and the second periodic signals in a second direction that are smaller than the phase shifts provided to the first and the second periodic signals in the first direction in response to the gain signal changing from the first value to the second value further comprises maintaining the incremental phase shifts provided to the first and the second periodic signals in the second direction constant in response to the gain signal changing from the first value to the second value.

23. The method of claim 21 wherein shifting the phases of the first and the second periodic signals relative to the input signal in response to the phase change signal further comprises shifting the phases of the first and the second periodic signals by a first incremental phase shift in the first direction in response to each pulse in the phase change signal and a direction signal being in a first state, and shifting the phases of the first and the second periodic signals by a second incremental phase shift in the second direction in response to each pulse in the phase change signal and the direction signal being in a second state.

24. The method of claim 21 wherein comparing a phase of a second periodic signal to the input signal to generate a gain signal further comprises comparing the phase of the second periodic signal to the input signal to generate a phase comparison signal, and setting a value of the gain signal based on whether the phase comparison signal has a predefined value for a predefined number of cycles of a clock signal.

25. The method of claim 21 wherein increasing incremental phase shifts provided to the first and the second periodic signals in a first direction in response to the gain signal changing from a first value to a second value further comprises increasing the incremental phase shifts provided to the first and the second periodic signals in the first direction in response to the gain signal indicating that edges of the first periodic signal are falling outside of sampling windows that each occur between one-quarter and three-quarters of a unit interval in the input signal.

* * * * *